United States Patent
Yamaguchi et al.

(10) Patent No.: US 7,800,174 B2
(45) Date of Patent: Sep. 21, 2010

(54) POWER SEMICONDUCTOR SWITCHING-DEVICE AND SEMICONDUCTOR POWER MODULE USING THE DEVICE

(75) Inventors: Motoo Yamaguchi, Anjo (JP); Naohito Kato, Kariya (JP); Yutaka Tomatsu, Okazaki (JP)

(73) Assignee: Denso Corporation, Kariya (JP)

( * ) Notice: Subject to any disclaimer, the term of this patent is extended or adjusted under 35 U.S.C. 154(b) by 975 days.

(21) Appl. No.: 11/101,651

(22) Filed: Apr. 8, 2005

(65) Prior Publication Data
US 2005/0224909 A1    Oct. 13, 2005

(30) Foreign Application Priority Data
Apr. 9, 2004  (JP) ............................. 2004-115400
Feb. 8, 2005  (JP) ............................. 2005-031728

(51) Int. Cl.
*H01L 31/062* (2006.01)
(52) U.S. Cl. .................. 257/341; 257/355; 257/360; 257/363; 257/401; 438/238
(58) Field of Classification Search ................ 257/341, 257/355, 360, 363, 401; 438/238
See application file for complete search history.

(56) References Cited

U.S. PATENT DOCUMENTS

| | | | |
|---|---|---|---|
| 4,567,874 A * | 2/1986 | Rouanes | 123/606 |
| 6,083,785 A * | 7/2000 | Segawa et al. | 438/238 |
| 6,286,491 B1 | 9/2001 | Fukatsu et al. | |
| 6,924,532 B2 * | 8/2005 | Pfirsch et al. | 257/341 |
| 2004/0075103 A1 | 4/2004 | Topp et al. | |
| 2005/0006758 A1 | 1/2005 | Wolf et al. | |

FOREIGN PATENT DOCUMENTS

| | | |
|---|---|---|
| JP | 08-335522 | 12/1996 |
| JP | 09-119369 | 5/1997 |
| JP | 2000-179440 | 6/2000 |

OTHER PUBLICATIONS

Office Action issued Oct. 5, 2009 in corresponding Japanese Application No. 2005-031728 with an at least partial English-language translation thereof.

* cited by examiner

Primary Examiner—Michael B Shingleton
(74) Attorney, Agent, or Firm—Nixon & Vanderhye, PC

(57) ABSTRACT

A single semiconductor power module includes a power semiconductor chip including an embedded IGBT (the power semiconductor switching-device) and a control semiconductor chip. The power semiconductor chip also includes a gate series resistor integrated therein as a resistor through which the control semiconductor chip drives the power semiconductor chip. In such a configuration, a gate wire between the gate series resistor and a gate has a small lead inductance and a small parasitic capacitance with respect to the ground.

13 Claims, 5 Drawing Sheets

POWER SEMICONDUCTOR SWITCHING-DEVICE AND SEMICONDUCTOR POWER MODULE USING THE DEVICE

CROSS REFERENCE TO RELATED APPLICATIONS

This application is based on and incorporates herein by reference Japanese Patent Application No. 2004-115400 filed on Apr. 9, 2004 and Japanese Patent Application No. 2005-31728 filed on Feb. 8, 2005, the contents of both of which are incorporated herein by reference.

FIELD OF THE INVENTION

The present invention relates to a power semiconductor switching-device and a semiconductor power module, and, more particularly, to an ignition apparatus using the power semiconductor switching-device and the semiconductor power module.

BACKGROUND OF THE INVENTION

A conventional ignition apparatus for supplying power to an ignition coil of an internal combustion engine is implemented by a semiconductor power module as disclosed in JP-2000-179440A (hereafter "patent reference 1"). FIG. 8 is a circuit diagram showing the semiconductor power module disclosed in patent reference 1 and FIG. 9 is a diagram showing a perspective view of a model of the module. The semiconductor power module is explained by referring to the figures as follows. Reference numeral 1 denotes a power semiconductor chip and reference numeral 2 denotes a ceramic board on which a control semiconductor chip (not shown) is mounted. The ceramic board 2 is a hybrid integrated circuit. The control semiconductor chip is a chip for implementing a current detection circuit 3, a driving circuit 4 and a gate series resistor 8. The power semiconductor chip 1 is a chip in which a main switch unit 5, a sub-switch unit 6 and a current detection resistor 7 are integrated. The main switch unit 5 and the sub-switch unit 6 are each an IGBT. The power semiconductor chip 1 and the hybrid integrated circuit 2 are sealed by a resin module 9, being connected to each other by bonding wires 10, which also connect the power semiconductor chip 1 and the ceramic board 2 to external terminals. The power semiconductor chip 1 and the ceramic board 2 are joined to a metallic base 11. In the configuration described above, the gate series resistor 8 also referred to as a gate protection resistor is normally created on the hybrid integrated circuit 2 as a thick-film resistor to provide endurance against a surge. Such a gate series resistor 8 is an excellent means for realizing a low-cost monolithic IC chip with a reduced magnitude of a surge to be endured in the control semiconductor chip.

The semiconductor power module modularizing the control semiconductor integrated circuit and the power semiconductor switching-device of these types is commonly known as a multi-chip semiconductor power module. By using the semiconductor power module with such a multi-chip configuration, the control semiconductor chip implementing the control semiconductor integrated circuit can be thermally separated from the power semiconductor switching-device, which dissipates a lot of heat. In addition, the power semiconductor chip, which implements the power semiconductor switching-device, and the control semiconductor chip can be fabricated in manufacturing processes optimum for the chips. Further, as a whole, the power semiconductor chip and the control semiconductor chip can be implemented as a single circuit component.

However, in the conventional semiconductor power module described above, the thick-film resistor in the hybrid integrated circuit serves as the gate series resistor cited above. Thus, the hybrid integrated circuit 2 or the ceramic board 2 becomes large in size, raising a problem that it is difficult to reduce the size of the semiconductor power module and impossible to implement a high-density device.

In addition, in the semiconductor power module including the hybrid integrated circuit, the substrate of the gate series resistor is connected to a gate in the power semiconductor chip by a bonding wire. Thus, the semiconductor power module has a problem that a surge current input through the gate series resistor increases a surge voltage applied to the gate in the power semiconductor chip due to another surge voltage generated by the surge current at the inductor of the bonding wire. That is, an input surge voltage that should naturally be attenuated by an effect provided by a low-pass filter circuit comprising the gate-series resistor and the capacitance of the gate is increased. It is to be noted that the surge voltage is input from a control input terminal of the semiconductor power module.

SUMMARY OF THE INVENTION

In view of the above problems, it is an object of the present invention to provide a semiconductor power module that can be fabricated at a low manufacturing cost and a small size while maintaining power sufficient to endure a surge voltage.

A power semiconductor switching-device of a semiconductor power module provided by the present invention as described above is created in a power semiconductor chip, having a gate serving as a control electrode connected to a control input terminal employed in the semiconductor power module as a terminal for applying a control voltage to the gate. The power semiconductor switching-device turns on and off a current flowing through a coil serving as a load born by the power semiconductor switching-device. The power semiconductor switching-device includes a gate series resistor, which is provided with a predetermined electrical resistance value, integrated on an insulation film of the power semiconductor chip and used for connecting the gate and the control input terminal to each other. That is, the present invention is characterized in that the gate series resistor connected externally to the conventional power semiconductor chip in the conventional semiconductor power module is directly integrated in the power semiconductor chip.

The power semiconductor switching-device provided by the present invention having such a configuration is capable of exhibiting the following effects.

First, the gate series resistor has an effect of attenuating a surge voltage applied to the gate on an oxide film having easily been damaged insulation from an external source by way of the control input terminal of the semiconductor power module similarly to the conventional power semiconductor chip. Further, the present invention is also capable of substantially reducing the inductance of a wire between the external gate series resistor, which is made as a thick-film resistor in the case of the conventional power semiconductor chip, and the end electrostatic capacitor such as the capacitor of the gate. This reduction makes it possible to increase relatively an effect of attenuating a surge voltage due to the voltage drop of the gate series resistor. It is to be noted that the inductance is mainly the inductance of a bonding wire between the externally connected gate series resistor and the control electrode capacitor of the power semiconductor switching-device. More particularly, if the externally connected gate series resistor of the conventional power semiconductor chip is used, even though the externally connected gate series resistor attenuates a surge voltage intruding by way of a control terminal of the package, a surge current flowing in through the externally connected gate series resistor generates a surge voltage at the inductor of the bonding wire on the gate side. Thus, the conventional power semiconductor module raises a problem that a surge voltage applied to the gate increases. In accordance with the present invention, on the other hand, since the resistance of the internally integrated gate series resistor is much greater than that of the externally connected gate series resistor including the bonding wire, the surge-voltage reduction effect provided by the internally gate series resistor is enhanced.

Second, even though a large voltage drop caused by a surge voltage is observed along the gate series resistor, the configuration of the device can be made compact almost without lengthening the manufacturing process. This is explained concretely by referring to FIG. 7 as follows. Reference numeral 27 denotes a power semiconductor switching-device (or a power IGBT) and reference numeral 8 the gate series resistor. Symbol Tc denotes a collector terminal of a package P of the power semiconductor switching-device and symbol C denotes the collector (a high-potential-side main electrode) of the power semiconductor chip. Symbol Lc denotes an internal lead inductance on the collector side. Symbol Te denotes an emitter terminal of the package P of the power semiconductor switching-device and symbol E denotes the emitter (a low-potential-side main electrode) of the power semiconductor chip. Symbol Le denotes an internal lead inductance on the emitter side and symbol Lo denotes a lead inductance of a line having a low potential.

There is a risk of a surge voltage intruding from the collector terminal Tc of the package P into the inside of the package P. When a surge voltage intrudes from the collector terminal Tc even if the power semiconductor switching-device 27 is put in an off state, a surge current flows to the emitter-side internal lead inductance Le and the lead inductance Lo of the low-potential line by way of a variety of capacitances of the power semiconductor switching-device 27. At that time, the surge current generates surge voltages at the emitter-side internal lead inductance Le and the lead inductance Lo of the low-potential line, causing the electric potential appearing at the emitter Te to greatly change. Accompanying the change in emitter electric potential, the electric potentials appearing at the collector C and gate G of the power semiconductor switching-device 27 also vary. The changes in electric potential increase for a configuration in which the emitter E of the power semiconductor switching-device 27 is connected to the emitter terminal Te by using a bent bonding wire having a relatively large wire length due to the bent shape. In the case of an on-board engine ignition circuit, a typical surge voltage generated outside the package P has a period shorter than 10 microseconds and a peak voltage in the range 1 to 10 KV. It is to be noted that the period and peak voltage are measured at the collector terminal Tc. The change in electric potential caused by such a surge voltage greatly changes an electric potential appearing at the gate G and the variation in gate (G) electric potential is applied to an output terminal of the control semiconductor chip 12 through the gate series resistor 8. However, because the tolerable voltage of the control semiconductor chip 12 is low, normally having a value smaller than several tens of voltages (V), it is necessary to absorb the variation in gate (G) electric potential as a potential variation applied to the output terminal of the control semiconductor chip 12 through the gate series resistor 8. In consequence, a voltage drop along the gate series resistor 8 increases to typically several hundreds of voltages (V). That is, there is a problem that a large voltage drop along the gate series resistor 8 is observed when a surge voltage intrudes into the package P.

However, even in the case of the conventional semiconductor power module, inventors of the present invention were aware of the fact that the power semiconductor switching-device for turning on and off a current, which flows through a coil load of equipment such as an ignition apparatus, at a high speed is fabricated from the beginning to typically have a thick field oxide film capable of enduring a surge voltage generated by the operation to turn on and off the current flowing through the coil load. That is, since the power semiconductor switching-device for turning on and off a load current also has a field oxide film capable of enduring a surge voltage generated by the operation to turn on and off the current, the gate series resistor can be integrated directly on the field oxide film. In other words, the conventional power semiconductor switching-device for turning on and off a current flowing through a large-inductance coil load such as an ignition coil allows a gate series resistor to be integrated in the conventional power semiconductor switching-device without a problem. Thus, the gate series resistor can be integrated in the power semiconductor switching-device almost without increasing the number of manufacturing processes to fabricate the power semiconductor switching-device. By integrating the gate series resistor in the power semiconductor switching-device, the inductance of a wire between the gate series resistor and the gate of the power semiconductor switching-device can be reduced considerably. As a result, a surge voltage caused by a surge current flowing from the gate terminal to the gate can also be decreased substantially.

In addition, since the parasitic electrostatic capacitance parasitically generated by the gate series resistor and a wire between the gate series resistor and the gate of the power semiconductor switching-device can also be reduced, the switching speed of the power semiconductor switching-device can also be increased. That is, the gate wire has a lead inductance and a lead parasitic capacitance so that, if a noise voltage with a high frequency arrives at the gate wire, an electric potential on the gate wire vibrates due to a resonance effect and other causes. An example of the noise voltage with a high frequency is variations in power-supply voltage, which propagate through the electromagnetic noise or the control semiconductor integrated circuit.

That is, in accordance with the present invention, since the current flowing through the coil load is turned on and off, the voltage appearing at the gate vibrates. Since the gate series resistor is integrated in the power semiconductor switching-device having large voltage endurance, however, the parasitic electrostatic capacitance parasitically generated by the gate series resistor and a wire between the gate series resistor and the gate of the power semiconductor switching-device as well as the lead inductance of the wire can be reduced so that the amount of the vibration observed in the voltage appearing at the gate as vibration caused by the parasitic electrostatic capacitance and the lead inductance can also be decreased. From the fabrication point of view, the gate series resistor can be created as a single element and, in comparison with a gate series resistor integrated in the control semiconductor integrated circuit, manufacturing processes can be shared and it is not necessary to specially provide voltage endurance in the chip. Thus, the manufacturing cost can be prevented from increasing substantially and miniaturization can be realized.

In a preferred configuration, the power semiconductor switching-device controls current flowing to the ignition coil to control electrical-discharge operations of the ignition plug. That is, this power semiconductor switching-device is applied to an ignition apparatus for supplying an ignition power to the primary side of the ignition coil of an internal combustion engine. By adopting such a configuration, the size of a semiconductor power module for an ignition-coil control in which a large surge voltage is induced in the gate as described above can be reduced almost without increasing the fabricating cost. It is to be noted that, if the power semiconductor switching-device is to be applied to such an ignition apparatus, in order to avoid internal insulation damage inflicted on the semiconductor in the gate series resistor as damage caused by a surge voltage, the gate series resistor is not created by introducing impurities in a process such as diffusion of the impurities in the power semiconductor chip or injection of ions into the chip. Instead, it is more desirable to carry out the following processes. First of all, a relatively thick insulation film having a typical thickness of at least 1 micron is created on the surface of the power semiconductor chip. A layer made of polysilicon or a metallic material having a high resistance is further deposited on the film. Then, a patterning process is carried out by performing a photolithography process to create a thin-film resistive material. In this case, there is also a merit that the inside of the chip can be utilized as the area of the power semiconductor switching-device.

In another preferred configuration, a low-potential electrode employed in the power semiconductor chip as a main electrode for injection of electric charges into the power semiconductor switching-device is connected through a bonding wire to an external terminal of a package encapsulating the power semiconductor chip. In a power semiconductor switching-device having such a structure, when an external surge voltage is generated, the surge voltage is amplified by the bonding wire and it is thereby quite within the bounds of possibility that the embedded gate series resistor and other components are damaged by the surge voltage. Since the gate series resistor is created by depositing a layer made of polysilicon or a metallic material having a high resistance on the insulation film and a patterning process is then carried out through a photolithography process to create a thin-film resistive material as described above, such damage can be prevented more effectively.

What is described above is explained more by referring to FIG. 7 as follows. When a large surge voltage is generated in the lead inductance of the bonding wire, due to an effect of the surge voltage, an electric potential appearing at the gate changes, causing a current flowing through the gate to vary as well. The variation in gate current causes a change in current flowing through the inductance of the gate wire, generating a secondary surge voltage on the gate wire. In accordance with this embodiment, however, the inductance between the gate series resistor and the gate is small. Thus, the effect of the secondary surge voltage can be reduced.

A further preferred configuration is characterized in that the gate series resistor is formed as a polysilicon area created on an insulation film on the surface of a power semiconductor chip as a resistor having a predetermined specific resistance. By creating the gate series resistor in this way, the chip internal area of the power semiconductor chip utilized as a power semiconductor switching-device is not consumed in the process to create the gate series resistor. Thus, the chip area does not increase and, in addition, it is not necessary to form a high-voltage endurance structure in the semiconductor substrate of the power semiconductor switching-device. As a result, the fabrication processes can be made simple. Note that it is proper to create the polysilicon area on a field oxide film formed on the semiconductor substrate or on an insulation film created on the field oxide film.

The preferred configuration of the power semiconductor switching-device is characterized in that the gate series resistor and the gate are created in the same polysilicon area deposition process. In this way, since the number of additional processes to form the gate series resistor can be reduced, the manufacturing yield can be prevented from decreasing.

The preferred configuration of the power semiconductor switching-device is also characterized in that the gate is created by injection of impurities as additional dope into a polysilicon area provided for the gate as an area created in the same polysilicon area deposition process as a polysilicon area for the gate series resistor. In this way, since the gate can be created by merely adding a doping process to inject impurities to the gate, the number of polysilicon deposition processes can be reduced without generating a difference in grade between the gate series resistor and the gate. In addition, the surface of the chip can be made flat. It is to be noted that the gate series resistor may also be created into a folded long shape. By creating the gate series resistor into such a shape, the number of impurities injected into the gate as dope can be reduced or the injection of impurities can even be eliminated.

The preferred configurations of the power semiconductor switching-device are characterized in that the power semiconductor chip is sealed in a package also encapsulating a control semiconductor chip for outputting a control voltage to the gate by way of the gate series resistor. Thus, the device can be made compact. In addition, since the inductance and parasitic capacitance of a wire between the control semiconductor chip and the gate series resistor embedded in the power semiconductor chip can be further decreased, the bad effect of a surge voltage on the control semiconductor chip can be further reduced and the switching speed can be increased due to a reduced bad effect of the low-pass filter.

In addition, in accordance with the structure of a multi-chip module, it is no longer necessary to create the gate series resistor from a thick-film resistive material so that the thick-film resistive substrate can be eliminated. Further, since it is also unnecessary to integrate the gate series resistor in the control monolithic semiconductor chip, the yield of the control monolithic semiconductor chip can be increased and the manufacturing cost can be decreased without the need to complicate the process to fabricate the control monolithic semiconductor chip, increase the chip area and devise techniques for improving cooling and electrical insulation of the control monolithic semiconductor chip.

In a still further preferred configuration, the gate series resistor is created on an insulation film, which is formed on a semiconductor substrate as a film having a thickness in the range 1.6 to 5 microns, as a resistor having a resistance value in the range 1 to 10 kilo-ohms. In addition, it is desirable to create an island area having another electric potential on the surface of the semiconductor substrate at a location separated away from the gate series resistor by at least a distance in the range 20 to 1,000 microns.

In a still further preferred configuration, terminals of the control monolithic semiconductor chip and a control-voltage input terminal of the gate series resistor embedded in the power semiconductor chip are connected to external terminals of the package by adoption of a wire-bonding technique. It is thus unnecessary to mount the control monolithic semiconductor chip and the power semiconductor chip on a circuit board. Instead, only the control monolithic semiconductor chip and the power semiconductor chip can be mounted on a cooling metallic board. It is to be noted that the cooling metallic board used for mounting the power semiconductor chip is also capable of serving as a main electrode of the power semiconductor switching-device. It is preferable to employ the cooling metallic board also to serve as a main electrode of the power semiconductor switching-device on the high-potential side. The control monolithic semiconductor chip can also be mounted on the cooling metallic board with an electrical-insulation film sandwiched between the chip and the board.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

An embodiment of the present invention is explained by referring to diagrams. It is to be noted, however, that the present invention is by no means limited to this embodiment. In addition, the technological concept of the present invention can of course be implemented by using other commonly known technologies.

Figure 1:
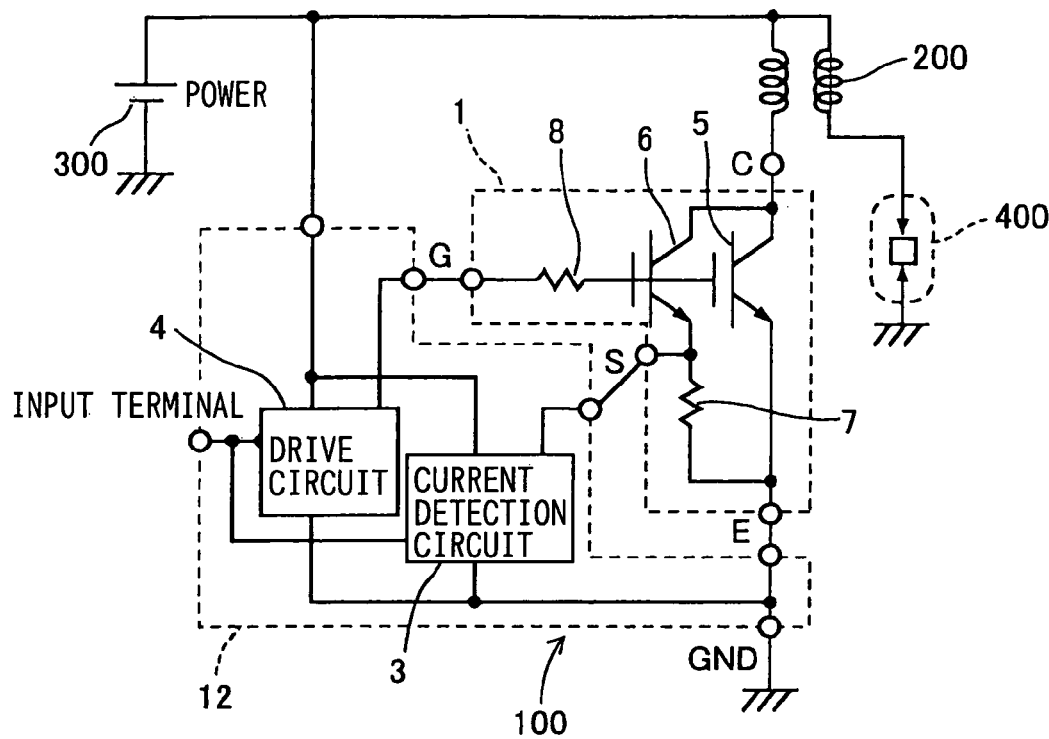
FIG. 1 is a circuit diagram showing an ignition system according to an embodiment of the present invention.

As an embodiment of a semiconductor power module using a power semiconductor switching-device provided by the present invention, an ignition system using an ignition apparatus employing the semiconductor power module is explained by referring to FIG. 1. A semiconductor power module 100 has a power semiconductor chip 1 and a control semiconductor chip 12. In the control semiconductor chip 12, a current detection circuit 3 and a driving circuit 4 are integrated by using an integrated-circuit technology. The power semiconductor chip 1 is a chip in which a main switch unit 5, a sub-switch unit 6, a current detection resistor 7 and a gate series resistor 8 are integrated. The main switch unit 5 and the sub-switch unit 6 are each an IGBT. In this embodiment, the current detection resistor 7 and the gate series resistor 8 are created in the same fabrication process in order to make the manufacturing process simple. However, the current detection resistor 7 having a small resistance value can be created by carrying out an impurity ion injection process or an impurity diffusion process on the surface of the substrate of the semiconductor. The IGBTs functioning as the main switch unit 5 and the sub-switch unit 6 are the power semiconductor switching-devices in the present invention. However, the power semiconductor switching-devices can each be implemented by a MOS transistor as well.

The emitter of the main switch unit 5 is connected to the ground while the emitter of the sub-switch unit 6 is connected to the ground through the current detection resistor 7. A direct-current power supply 300 supplies power to the collectors of the main switch unit 5 and the sub-switch unit 6 by way of the primary-side coil of an ignition coil 200. The direct-current power supply 300 also supplies power to an ignition plug 400 of the internal combustion engine by way of the secondary-side coil of the ignition coil 200. In addition, the direct-current power supply 300 supplies power to the current detection circuit 3 and the driving circuit 4 as well. Virtually, the main switch unit 5 and the sub-switch unit 6 share the same gate, which is connected to an output terminal of the driving circuit 4 by the gate series resistor 8.

The current detection circuit 3 detects a voltage drop through the current detection resistor 7, amplifies the detected voltage drop and supplies the amplified voltage drop to the input terminal of the driving circuit 4. The driving circuit 4 executes ignition timing control in accordance with a control signal supplied to an input terminal of the driving circuit 4 from an external controller such as an ECU. It is to be noted that the external controller itself is shown in none of the figures. The driving circuit 4 also executes feedback control by implementing typically PWM control on currents flowing through the power semiconductor switching-devices based on the voltage drop supplied to the input terminal of the driving circuit 4. A primary current flows intermittently through the ignition coil 200 due to the switching operations of the power semiconductor switching-devices, i.e., the main switch unit 5 and the sub-switch unit 6, generating an ignition spark voltage in the secondary-side coil of the ignition coil 200. The intermittent ignition spark voltage in turn causes the ignition plug 400 to carry out spark discharges periodically. The circuit configurations of the current detection circuit 3 and the driving circuit 4 themselves are essentially the same as those of the conventional semiconductor power module disclosed in the patent reference cited earlier. Thus, no more explanation of the circuit configurations of the current detection circuit 3 and the driving circuit 4 is given in this specification. Of course, as the internal circuit configuration of the control semiconductor chip 12, another commonly known configuration can be adopted.

Figure 2:
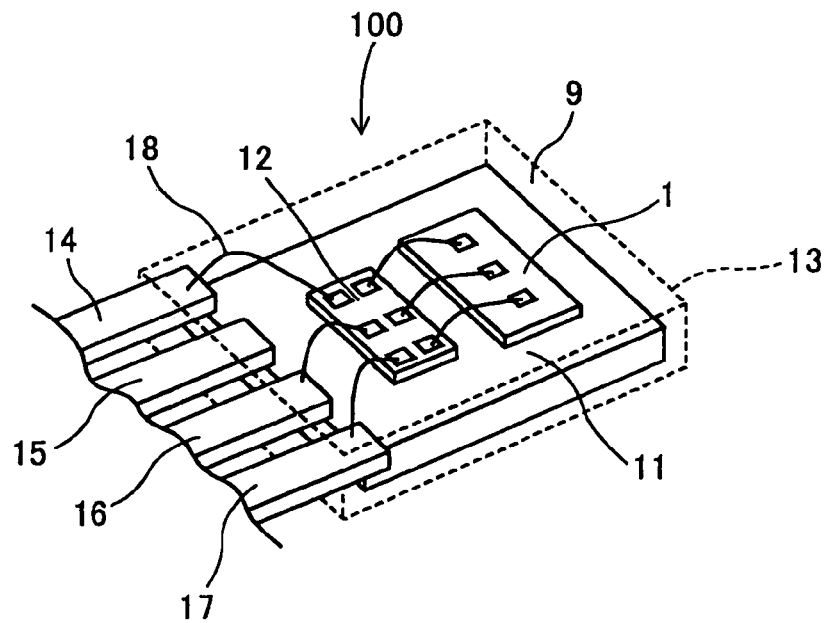
FIG. 2 is a diagram showing a perspective view of a model of the semiconductor power module employed in the ignition system shown in FIG. 1.

FIG. 2 is a diagram showing a perspective view of a model of the semiconductor power module 100 shown in FIG. 1. The power semiconductor chip 1 and the control semiconductor chip 12 are joined to each other on a metallic base 11. It is to be noted that the power semiconductor chip 1 is joined to the metallic base 11 directly while the control semiconductor chip 12 is attached to the metallic base 11 through an electrical insulator.

The metallic base 11 is sealed in a mold resin unit 13 with a back face thereof exposed. The mold resin unit 13 supports terminals 14 to 17. The terminals 14, 16 and 17 are supported by the mold resin unit 13, being separated from the metallic base 11. On the other hand, the terminal 15 is joined to the metallic base 11 to form a collector C, which is an output terminal of the semiconductor power module 100. Reference numeral 18 denotes bonding wires connecting the terminals 14, 16 and 17, electrode areas of the control semiconductor chip 12 and electrode areas of the power semiconductor chip 1 to each other. It is to be noted that, in the model shown in FIG. 2, a bonding pad serving as a main electrode of the power semiconductor chip 1 is connected to the (external) terminals 14, 16 and 17 through a bonding pad on the control semiconductor chip 12. However, the bonding pad serving as the main electrode of the power semiconductor chip 1 can of course be connected directly to the (external) terminals 14, 16 and 17 by bonding wires. In accordance with this configuration, a thick-film circuit board is not required and the cooling characteristic of the control semiconductor chip 12 is improved.

Figure 3:
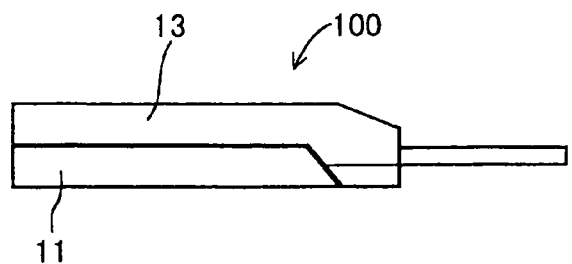
FIG. 3 is a diagram showing a side view of the semiconductor power module shown in FIG. 2.
Figure 4:
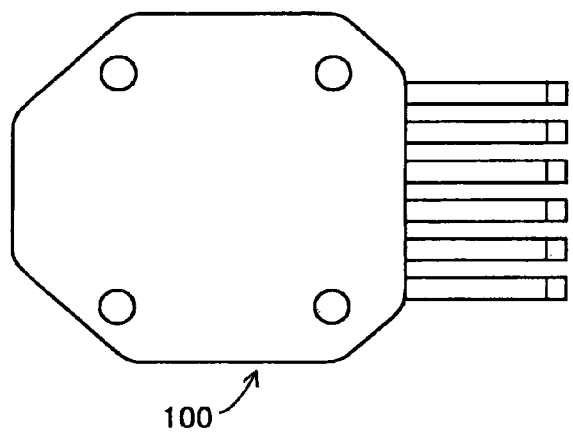
FIG. 4 is a diagram showing a top view of the semiconductor power module shown in FIG. 3.

FIG. 3 is a diagram showing a side view of the semiconductor power module 100 whereas FIG. 4 is a diagram showing a top view of the semiconductor power module 100. However, the semiconductor power module 100 shown in FIGS. 3 and 4 further has 2 additional terminals.

Figure 6:
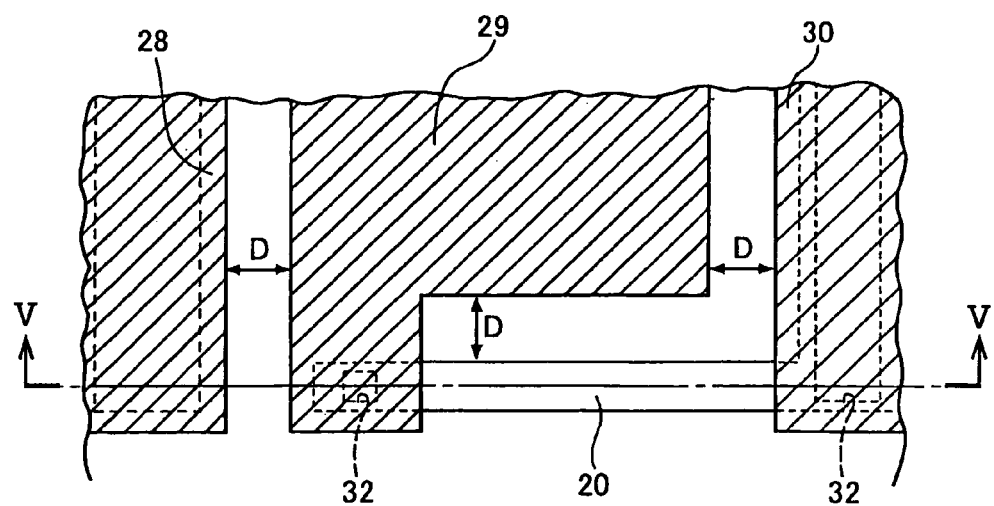
FIG. 6 is a diagram showing a portion of a top view of the power semiconductor chip shown in FIG. 5.
Figure 5:
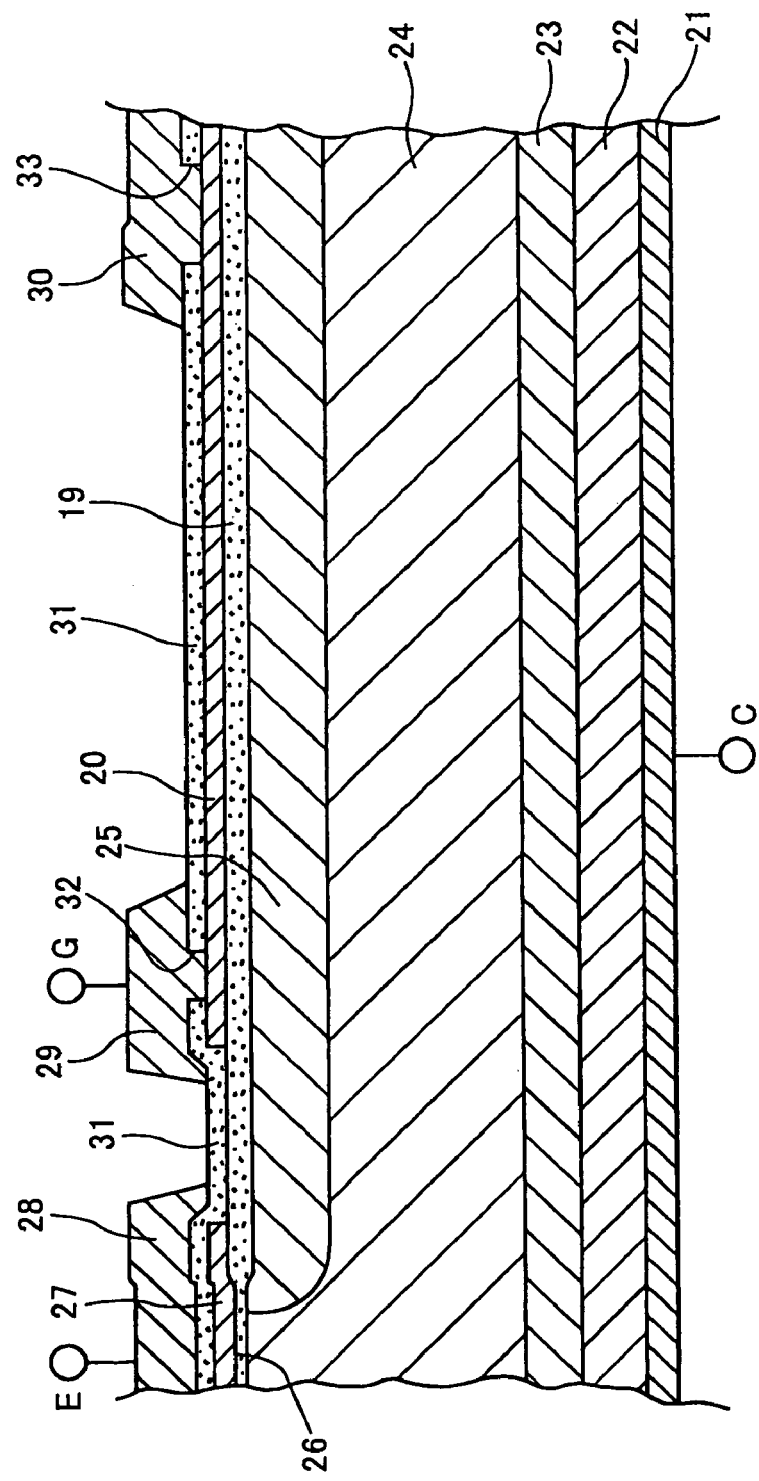
FIG. 5 is a diagram showing a cross section of the power semiconductor chip.

FIG. 5 is a diagram showing a cross section of the power semiconductor chip 1 whereas FIG. 6 is a diagram showing a portion of a top view of the power semiconductor chip 1. The power semiconductor chip 1 is obtained by forming a polysilicon resistor area 20 serving as the gate series resistor 8 on a field insulation film 19 of a semiconductor chip in which an ordinary IGBT is created. The thickness of the field insulation film 19 is at least 1.6 microns. In addition, the polysilicon resistor area 20 is formed at a distance D of at least 10 microns or even a better distance D of at least 20 microns from other wires and a well area created on the surface of the semiconductor substrate as a different-potential area having an electric potential different from that of the semiconductor substrate.

Other members are explained as follows. Reference numeral 21 denotes a metallic plate serving as the collector and reference numeral 22 denotes a collector p-type area. Reference numerals 23 and 24 denote a high-concentration n-type area and a low-concentration n-type voltage-enduring area respectively. Reference numeral 25 denotes a substrate-side p-type area and reference numeral 26 denotes a gate insulation film. Reference numeral 27 denotes a polysilicon gate on the gate insulation film 26. Reference numeral 28 denotes an emitter terminal made of aluminum. Reference numeral 29 denotes a gate terminal made of aluminum. The gate terminal 29 is the control input terminal. Reference numeral 30 denotes a gate-connected electrode and reference numeral 31 denotes an insulation film for passivation use. Reference numerals 32 and 33 each denote a contact opening provided on the field oxide insulation film 31. The contact opening 32 is used for connecting the gate terminal 29 and the polysilicon resistor area 20 to each other. On the other hand, the contact opening 33 is used for connecting the gate-connected electrode 30 to the polysilicon resistor area 20.

The emitter terminal 28 is connected to a high-concentration n-type emitter area through a contact opening facing the field insulation film 19 in a member shown in none of the figures and forms a commonly known IGBT in conjunction with other areas. The substrate-side p-type area 25 has the same electric potential as that of the ground. Thus, the substrate-side p-type area 25 suppresses bad electrostatic effects caused by variations in electric potential in the polysilicon resistor area 20 provided right above the substrate-side p-type area 25.

The gate-connected electrode 30 is located between the polysilicon resistor area 20 and the silicon gate 27 to exhibit an effect of applying a voltage-drop effect of the polysilicon resistor area 20 uniformly to all portions of the silicon gate 27.

The polysilicon resistor area 20 and the silicon gate 27 are both created in a patterning process comprising a common polysilicon deposition CVD process and a photolithography process following the polysilicon deposition CVD process. However, in the case of the silicon gate 27, injection of impurities as additional dope by injection of additional ions reduces the electrical-resistance value of the silicon gate 27.

In addition, the same polysilicon resistor area 20 as that described above may be created on a field insulation film of the power semiconductor chip 1 in which a vertical-type power MOS transistor is formed.

Figure 7:
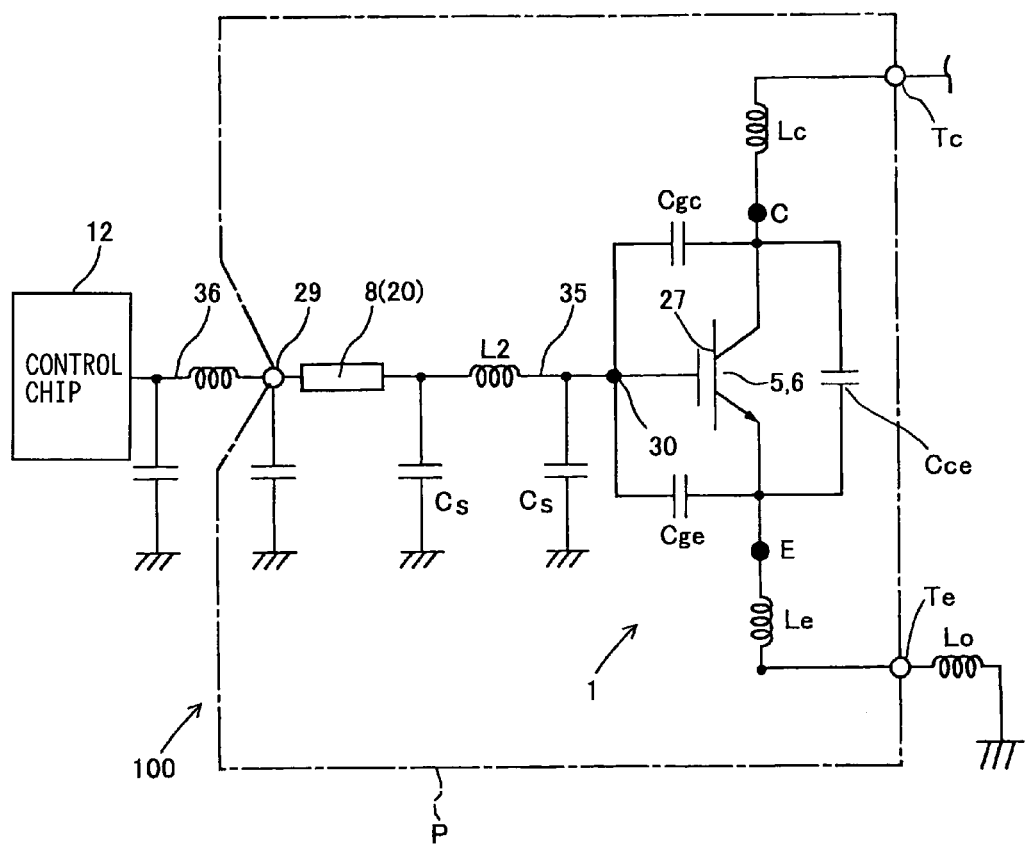
FIG. 7 is a diagram showing an equivalent circuit of the power semiconductor chip shown in FIG. 5.
Figure 8:
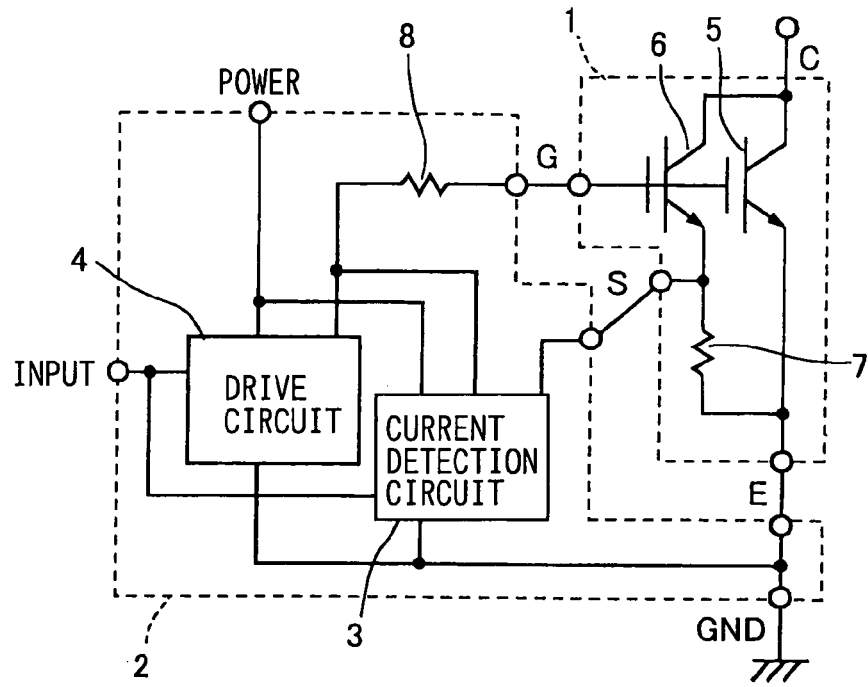
FIG. 8 is a circuit diagram showing the semiconductor power module of the conventional ignition apparatus.
Figure 9:
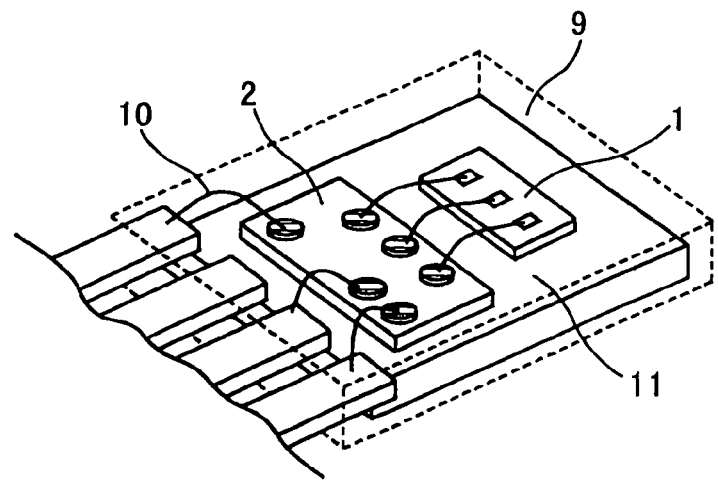
FIG. 9 is a diagram showing a perspective view of a model of the module semiconductor power module shown in FIG. 8.

The main effects have been described. Other effects are explained concretely by referring to FIG. 7 and showing an equivalent circuit of the semiconductor power module 100 implemented by the embodiment. Symbol Cgc denotes an electrostatic capacitance between the gate and the collector C, whereas symbol Cge denotes an electrostatic capacitance between the gate and the emitter E. Symbol L2 denotes the lead inductance of a gate wire 35 between the silicon gates 27 of the power semiconductor switching-devices 5 and 6 and the gate series resistor 8. Symbol Cs denotes a parasitic capacitance of the gate wire 35 as a capacitance with respect to the ground. Reference numeral 36 denotes a gate wire between the polysilicon resistor area 20 and the control semiconductor chip 12. Symbol Lc denotes the internal lead inductance of a bonding wire or the like typically on the collector side. On the other hand, symbol Le denotes the internal lead inductance of a bonding wire or the like typically on the emitter side. Symbol Lo denotes the lead inductance of a wire with a low electric potential. Symbol P denotes a resin or ceramic package for encapsulating the IGBTs (the power semiconductor switching devices) 5 and 6 with which the gate series resistor 8 is integrated. The other effects are explained by assuming that the electrical resistance of the polysilicon resistor area 20, that is, the electrical resistance of gate series resistor 8, is large.

Since the polysilicon resistor area 20 serving as the gate series resistor 8 is integrated in the power semiconductor chip 1, the lead inductance L2 and parasitic capacitance Cs of the gate wires 35 between the gate series resistor 8 and the silicon gates 27 of the power semiconductor switching-devices 5 and 6 are substantially smaller than those of the conventional semiconductor power module.

When a surge voltage is generated in an operation to turn off the power semiconductor switching-devices 5 and 6 to abruptly raise voltages appearing on the collector C and the emitter E, the electric potential appearing at the silicon gate 27 also makes an attempt to rise to follow the abrupt rises of the voltages appearing on the collectors C and the emitter E through the electrostatic capacitance Cgc of the collector C and the electrostatic capacitance Cge of the emitter E. At that time, if the gate series resistor 8 between the constant-potential output terminal of the control semiconductor chip 12 and the silicon gate 27 does not exist, the behavior displayed by the silicon gate 27 to rise its electric potential to follow the abrupt rises of the voltages is obstructed. In addition, the large parasitic capacitances of the gate wires 35 and 36 also obstruct the behavior. Thus, a large surge voltage is applied to the gate insulation film, causing a risk of damage to the film. In the case of the conventional semiconductor power module, the gate series resistor 8 is attached externally to the power semiconductor chip 1. In this case, the parasitic capacitance between the gate series resistor 8 and the silicon gate 27 is large, raising the same problem. In the case of this embodiment, however, electrostatic capacitance division caused by a capacitance Cs displayed by the gate wire 35 as a capacitance with respect to the ground is decreased. Thus, the electric potential appearing at the silicon gate 27 is capable of well following the abrupt rises of the voltages appearing on the collector C and the emitter E. As a result, the damage caused by the surge voltage as a damage inflicted on the gate insulation film can be better prevented.

In addition, since the lead inductance L2 and the parasitic capacitance Cs are small, vibration (ringing) of the gate electric potential following abrupt variations in gate electric potential at that time can also be reduced. Further, the cutoff frequency of a low-pass filter formed by the parasitic capacitance Cs and the electrical resistance of the silicon gate 27 can be decreased. Thus, a switching characteristic in an operation to drive the power semiconductor switching-devices 5 and 6 from the control semiconductor chip 12 can also be improved.

The above embodiments are merely described for the purpose of exemplification of the present invention. The present invention is not limited to these embodiments. Accordingly, various modifications may be made based on the knowledge of persons skilled in the art to the above embodiments without departing from the subject matter of the present invention.

What is claimed is:

1. An apparatus comprising:
   an ignition coil; and
   a power semiconductor device disposed in a power semiconductor chip, the power semiconductor device comprising:
      a power transistor coupled to the ignition coil, the power transistor switching a load current flowing through the ignition coil to an on position and an off position during operation to control the load current in order to control electrical discharge operations of an ignition plug driven by the ignition coil,
      a control input terminal for receiving a control voltage at a gate of the power transistor; and
      a gate series resistor created on an insulation film of the power semiconductor chip, the gate series resistor having a predetermined resistance value and directly connecting the gate to the control input terminal, the creation of the gate series resistor on the insulation film reducing a surge voltage applied to the gate when the load current is switched to the off position,
      wherein the gate series resistor is made of poly silicon and disposed right above a P type area in the power semiconductor chip via the insulation film, and
      wherein the P type area has a ground potential.

2. An apparatus according to claim 1, wherein a low potential terminal employed in the power semiconductor chip as a main electrode for injection of electrical charges into the power semiconductor switching device is connected to an external terminal of a package incorporating the power semiconductor chip by a bonding wire.

3. An apparatus according to claim 1, wherein the gate of the power semiconductor switching-device is connected to an external terminal of a package incorporating the power semiconductor chip by a bonding wire.

4. An apparatus according to claim 1, wherein the gate series resistor is formed on a polysilicon area created on an insulation film on the surface of the power semiconductor chip and has a predetermined specific resistance.

5. An apparatus according to claim 4, wherein the gate series resistor and the gate are created in the same polysilicon area deposition process and thus occupy a common layer of the switching device.

6. An apparatus according to claim 4, wherein the gate includes injected dopants in a polysilicon area provided for the gate, wherein the area is formed in the same polysilicon area deposition process as a polysilicon area for the gate series resistor.

7. An apparatus comprising:
   an ignition coil; and
   a semiconductor power module comprising:
      a power semiconductor switching transistor in a power semiconductor chip, the power semiconductor switching transistor being coupled to the ignition coil, the power semiconductor switching transistor switching a load current flowing through the ignition coil on and off to control the load current in order to control electrical discharge operations of an ignition plug driven by the ignition coil, the power semiconductor switching transistor having a control input terminal for receiving a control voltage at a gate of the power semiconductor switching transistor, and a gate series resistor created on an insulation film of the power semiconductor chip, the gate series resistor having a predetermined resistance value, the gate series resistor directly connecting the gate to the control input terminal, the creation of the gate series resistor on the insulation film reducing a surge voltage applied to the gate; and
      a control semiconductor chip encapsulated in a same package as the power semiconductor chip and outputting a control voltage to the gate through the gate series resistor,
   wherein the gate series resistor is made of poly silicon and disposed right above a P type area in the power semiconductor chip via the insulation film, and
   wherein the P type area has a ground potential.

8. An apparatus according to claim 1, wherein
   the power transistor is an IGBT, and
   the power transistor, the control input terminal and the gate series resistor are sealed with a resin mold.

9. An apparatus according to claim 8, wherein:
   the gate series resistor has a resistance in a range between 1 kilo-ohm and 10 kilo-ohms, and
   the gate series resistor is spaced apart from a collector of the power transistor by a distance between 20 micrometers and 1000 micrometers.

10. An apparatus according to claim 9, wherein the gate series resistor is disposed on the semiconductor chip without a circuit board so that a parasitic capacitance between the semiconductor chip and the gate series resistor is reduced.

11. An apparatus according to claim 7, wherein the power semiconductor switching transistor is an IGBT, and the package is made of mold resin.

12. An apparatus according to claim 11, wherein:
   the gate series resistor has a resistance in a range between 1 kilo-ohm and 10 kilo-ohms, and
   the gate series resistor is spaced apart from a collector of the power semiconductor switching transistor by a distance between 20 micrometers and 1000 micrometers.

13. An apparatus according to claim 12, wherein the gate series resistor is disposed on the power semiconductor chip without a circuit board so that a parasitic capacitance between the semiconductor chip and the gate series resistor is reduced.

* * * * *